(12) United States Patent
Hsu (10) Patent No.: US 11,561,588 B2
(45) Date of Patent: Jan. 24, 2023

(54) PIVOT SHAFT STRUCTURE MOVING AROUND VIRTUAL AXIS

(71) Applicant: FIRST DOME CORPORATION, New Taipei (TW)

(72) Inventor: An Szu Hsu, New Taipei (TW)

(73) Assignee: Fositek Corporation, New Taipei (TW)

( * ) Notice: Subject to any disclaimer, the term of this patent is extended or adjusted under 35 U.S.C. 154(b) by 374 days.

(21) Appl. No.: 16/835,766

(22) Filed: Mar. 31, 2020

(65) Prior Publication Data

US 2021/0048852 A1   Feb. 18, 2021

(30) Foreign Application Priority Data

Aug. 14, 2019   (TW) ................................ 108128953

(51) Int. Cl.
| | |
|---|---|
| *G06F 1/16* | (2006.01) |
| *H05K 5/02* | (2006.01) |
| *B25G 3/38* | (2006.01) |
| *H04M 1/02* | (2006.01) |

(52) U.S. Cl.
CPC ............ *G06F 1/1681* (2013.01); *B25G 3/38* (2013.01); *G06F 1/169* (2013.01); *H05K 5/0226* (2013.01); *E05Y 2900/606* (2013.01); *H04M 1/0218* (2013.01); *H04M 1/0243* (2013.01)

(58) Field of Classification Search
CPC ............................ G06F 1/1616; G06F 1/1681
See application file for complete search history.

(56) References Cited

U.S. PATENT DOCUMENTS

| | | | |
|---|---|---|---|
| 2019/0166703 A1* | 5/2019 | Kim ...................... | G06F 1/1641 |
| 2020/0174531 A1* | 6/2020 | Lin ...................... | E05D 11/0054 |
| 2020/0264673 A1* | 8/2020 | Kim ...................... | G06F 1/1652 |
| 2020/0409429 A1* | 12/2020 | Hsu ........................ | G06F 1/1681 |
| 2021/0026407 A1* | 1/2021 | Park ...................... | H04M 1/022 |

* cited by examiner

*Primary Examiner* — Anthony Q Edwards
(74) *Attorney, Agent, or Firm* — Rosenberg, Klein & Lee (57) ABSTRACT

The pivot shaft structure moving around virtual axis includes an assembly of a main body, a first operation board and a second operation board disposed on the main body. The first operation board has an arm section. The second operation board has an arm section. The arm sections of the first and second operation boards are respectively received in a first arched rail and a second arched rail of the main body. The first and second arched rails are arched and disposed around a virtual axis. When a user operates the first operation board or the second operation board to move, the first operation board or the arm section thereof and the second operation board or the arm section thereof respectively synchronously move around the virtual axis along the first and second arched rails toward each other to achieve opening/closing effect.

20 Claims, 9 Drawing Sheets

PIVOT SHAFT STRUCTURE MOVING AROUND VIRTUAL AXIS

BACKGROUND OF THE INVENTION

1. Field of the Invention

The present invention relates generally to a pivot shaft structure, and more particularly to a pivot shaft structure moving around virtual axis, in which the operation boards of the pivot shaft move around a virtual axis to reduce the assembling/motional space of the components.

2. Description of the Related Art

There are various electronic apparatuses provided with covers or display screens, such as mobile phones, notebooks, PDA and electronic books. The covers or display screens are pivotally mounted on the electronic apparatuses via pivot pins or rotary shafts, whereby the covers or the display screens can be freely rotated and opened/closed under external force. For example, Taiwanese Patent No. 97222022 "rotary shaft structure" and Taiwanese Patent No. 98207366 "pivot shaft structure" disclose typical embodiments.

In order to operate the display module (such as the screen) and/or the apparatus body module of the electronic apparatus in more operation modes to widen the application range thereof, a conventional dual-shaft mechanism mounted between the display module and the apparatus body module has been developed to rotate the display module and/or the apparatus body module by different angles in accordance with different operation modes. For example, Taiwanese Patent No. 99211350 "dual-shaft hinge device", Taiwanese Patent No. 99225737 "biaxial hinge device" and U.S. Pat. No. 7,512,426 B2 "mobile communications device with synchronizing hinge" disclose typical embodiments.

With respect to the operation and structural design of such pivot shaft assembly assembled with the flexible screen, in practice, in order to provide a bending operation space for the flexible screen, at least one set of dual-shaft assembly in cooperation with the rotary shaft to displace and move must be employed. For example, Taiwanese Patent No. 105126016 "axis displacement pivot shaft device" discloses a typical embodiment.

The aforesaid embodiment discloses a structure assembly in which multiple gear sections, rod sections and displacement guide blocks are respectively disposed between two rotary shafts (or four rotary shafts). In addition, the racks are disposed on the two rotary shafts (or four rotary shafts) to respectively engage with the gear sections. According to the above technical structure, when a user operates the flexible screen to bend, open or close, the two rotary shafts (or four rotary shafts) are forced to displace and move.

However, as well known by those who are skilled in this field, in condition that the requirement for lightweight and thin (or simplified) design of the electronic apparatus is satisfied, the conventional pivot shaft device has the shortcomings that the structure and the cooperative form are more complicated and it is more troublesome to manufacture and assemble the components. Also, the assembling tolerance is large and the cost is high. Moreover, for providing the bending opening/closing operation space for the flexible screen, the two rotary shafts (or four rotary shafts) will have larger volume to occupy more (motional) space. This is not what we expect.

Especially, when a user operates the display module to rotate, the multiple gears and link plates are driven to drive the rotary shafts, whereby the apparatus body module is driven to synchronously rotate. The rotary shafts are assembled with the multiple gears and link plates for transmitting power so that the structural relationship between these components is relatively complicated. These components are troublesome to assemble and the assembling tolerance is large. Also, these components have larger volume to occupy much room. This is not what we expect.

To speak representatively, the conventional rotary shaft mechanism or pivot shaft and the relevant connection components thereof have some shortcomings in use and structural design. The rotary shaft structure and the relevant components can be redesigned to eliminate the above shortcomings in operation and change the use form as well as widen the application range. For example, in condition that the requirement for lightweight and thin design of the electronic apparatus is satisfied and the pivot shaft device or the relevant components are such structurally designed that the components are easy to assembly and install, the above technical literatures fail to provide the operation space for receiving the bent section of the flexible screen. Therefore, it is an especially considered structural issue how to apply the pivot shaft device to the bending opening/closing operation of the flexible screen and establish a space for receiving the bent section of the flexible screen. Moreover, the cooperative gap between the pivot shaft device or the components and the motional range are as minified as possible. Therefore, the entire electronic apparatus can be designed with a tidy and beautiful appearance to provide a visual effect. In addition, the shortcoming of the conventional pivot shaft device that the cooperative components have larger volume to occupy more (motional) space. None of the above references specifically teaches, suggests or discloses the above issues.

SUMMARY OF THE INVENTION

It is therefore a primary object of the present invention to provide a pivot shaft structure moving around virtual axis, which is applicable to a flexible screen to reduce assembling/motional space of the components. The pivot shaft structure moving around virtual axis has a simplified structure and smaller volume. The pivot shaft structure moving around virtual axis includes an assembly of a main body, a first operation board and a second operation board disposed on the main body. The first operation board has an arm section. The second operation board has an arm section. The arm sections of the first and second operation boards are respectively received in a first arched rail and a second arched rail of the main body. The first and second arched rails are arched and disposed around a virtual axis. When a user operates the first operation board or the second operation board to move, the first operation board or the arm section thereof and the second operation board or the arm section thereof respectively synchronously move around the virtual axis along the first and second arched rails toward each other to achieve opening/closing effect. The arm section of the first operation board and the arm section of the second operation board cooperate with the first and second arched rails to together define a space in the closing operation for receiving the bent section of a flexible screen. This improves the shortcomings of the conventional pivot shaft device that the structure is complicated and it is troublesome to manufacture and assemble the components and the assembling tolerance is large and the cost is high.

In the above pivot shaft structure moving around virtual axis, the main body is an arched cylindrical body having a chamber with an arched (cross-sectional) structure. Multiple restriction sections are disposed or integrally formed in the chamber to define the first and second arched rails. The curvature of the arched structures of the arm section of the first operation board and the arm section of the second operation board is equal to the curvature of the first arched rail and the curvature of the second arched rail.

In the above pivot shaft structure moving around virtual axis, the main body is disposed on a base seat. The base seat has a chamber for receiving the main body. The main body is permitted to reciprocally move within the chamber of the base seat. The first and second arched rails and the arm section of the first operation board and the arm section of the second operation board respectively have obliquely extending structures. When the first operation board or the arm section thereof moves along the first arched rail to one side, the main body is pushed to move from a first position (or open position) of the chamber to a second position (or closed position), whereby the second operation board or the arm section thereof is synchronously driven to move the second arched rail to the other side.

The present invention can be best understood through the following description and accompanying drawings, wherein:

DETAILED DESCRIPTION OF THE PREFERRED EMBODIMENTS

Figure 1:
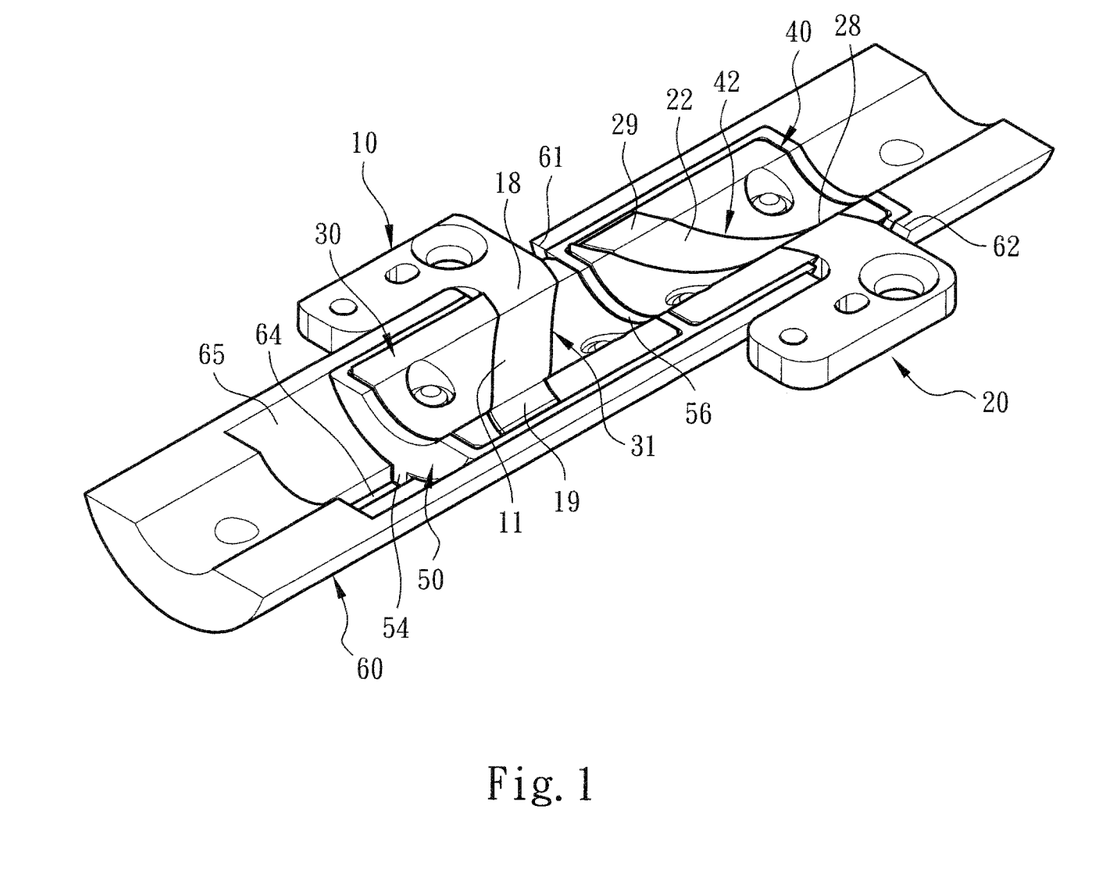
FIG. 1 is a perspective view of the present invention, showing that the main body is assembled with the base seat and the first and second operation boards and the main body is positioned in the first position of the chamber of the base seat.
Figure 2:
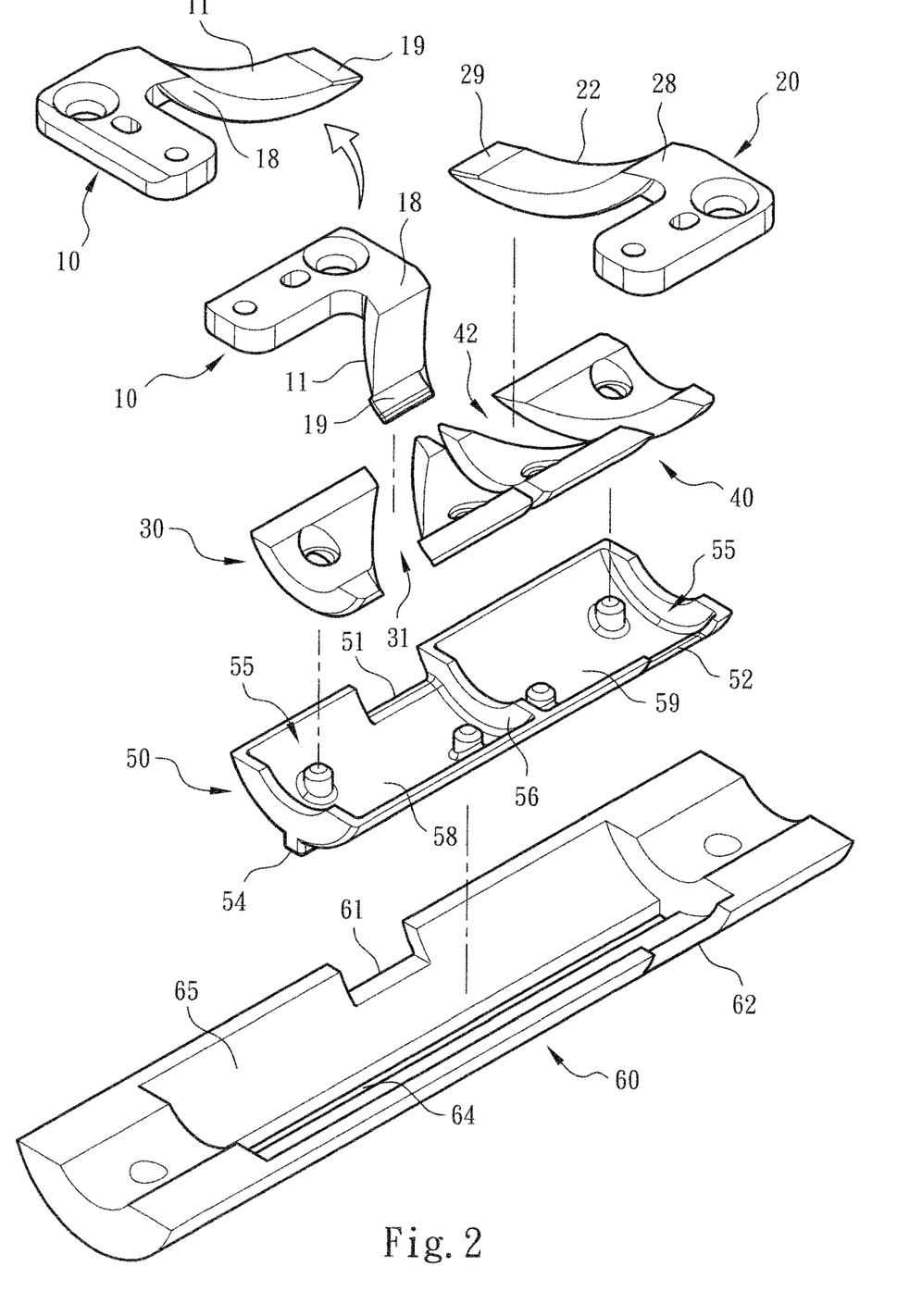
FIG. 2 is a perspective exploded view of the present invention according to FIG. 1, showing the structures of the main body, the base seat, the first and second operation boards and the restriction sections disposed on the main body.
Figure 3:
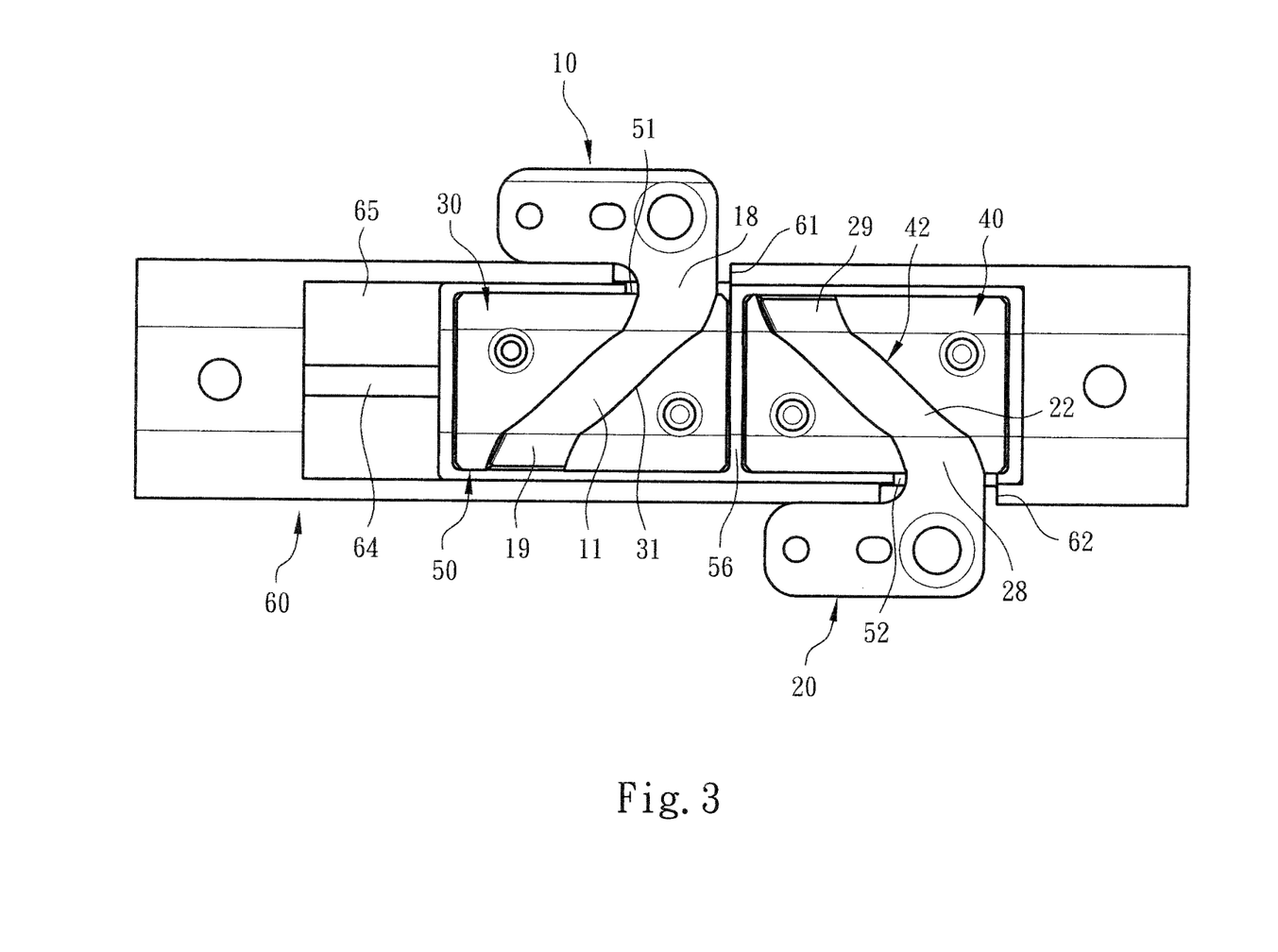
FIG. 3 is a plane view of the present invention according to FIG. 1, showing that the first and second operation boards are positioned in the open position.

Please refer to FIGS. 1, 2 and 3. The pivot shaft structure moving around virtual axis of the present invention includes an assembly of a main body 50, a first operation board 10 and a second operation board 20. The upper section, upper side, bottom section, lower side, left end, left side, right end, right side, etc. mentioned hereinafter are recited with the direction of the drawings as the reference direction.

As shown in the drawings, the main body 50 is an arched plate body or a cylindrical (or substantially semi-cylindrical) body. The main body 50 has an open chamber 55 with an arched (cross-sectional) structure. A diaphragm 56 is selectively disposed in a substantially middle position of the chamber 55 to partition the chamber 55 into a first (arched) cavity 58 and a second (arched) cavity 59. In addition, the upper side (with reference to the drawings) of the main body 50 is formed with a first notch 51 in communication with the first cavity 58. The lower side of the main body 50 is formed with a second notch 52 in communication with the second cavity 59. The first notch 51 is positioned in a position in adjacency to the diaphragm 56 (or in adjacency to the middle of the main body 50). The second notch 52 is positioned in a position distal from the diaphragm 56 (or distal from the middle of the main body 50).

In this embodiment, multiple restriction sections are disposed or integrally formed in the chamber 55. The restriction sections can be classified into first restriction section 30 and second restriction section 40 respectively positioned in the first and second cavities 58, 59. The first and second restriction sections 30, 40 are formed with multiple block bodies with arched cross section. A first arched rail 31 is disposed in or defined by the first restriction section 30 in communication with the first notch 51. A second arched rail 42 is disposed in or defined by the second restriction section 40 in communication with the second notch 52.

In a preferred embodiment, the first and second arched rails 31, 42 respectively have the form of obliquely extending structures.

With the direction of the drawings as the reference direction, the first arched rail 31 obliquely extends from the upper side (or the first notch 51) to the lower side and left end of the main body 50. The second arched rail 42 obliquely extends from the upper side to the lower side and right end of the main body 50 (or the second notch 52).

As shown in FIGS. 1, 2 and 3, the first and second operation boards 10, 20 are disposed on the main body 50. The first operation board 10 has an arched arm section 11 protruding from the first operation board 10. The second operation board 20 has an arched arm section 22 protruding from the second operation board 20. The arched arm sections 11, 22 of the first and second operation boards 10, 20 are respectively reciprocally movably received in the first and second arched rails 31, 42 of the main body 10. In addition, the arched arm sections 11, 22 of the first and second operation boards 10, 20 respectively have connection ends 18, 28 and free ends 19, 29.

In this embodiment, the arm section 11 of the first operation board 10 obliquely extends from the connection end 18 to the free end 19 and the left end (with reference to the drawings) corresponding to the first arched rail 31. The arm section 22 of the second operation board 20 obliquely extends from the connection end 28 to the free end 29 and the left end (with reference to the drawings) corresponding to the second arched rail 42.

As shown in the drawings, the main body 50 can be assembled and disposed on a base seat 60. The base seat 60 is an arched plate body or a cylindrical (or substantially semi-cylindrical) body. The base seat 60 has an open chamber 65 with an arched (cross-sectional) structure for receiving the main body 50. The main body 50 is permitted to reciprocally move within the chamber 65 of the base seat 60. The upper side of the base seat 60 is formed with a first notch 61 corresponding to the first notch 51 of the main body. The lower side of the base seat 60 is formed with a second notch 62 corresponding to the second notch 52 of the main body.

In a preferred embodiment, an assembling section 54 in the form of an elongated raised structure (or elongated sunken structure) is disposed under the bottom section of the main body 50. A guide section 64 in the form of an elongated sunken structure (or elongated raised structure) is disposed in the chamber 65 of the base seat 60 corresponding to the assembling section 54 of the main body 50. Accordingly, when the main body 50 is mounted in the chamber 65 of the base seat, the assembling section 54 of the main body is assembled with the guide section 64 of the base seat, whereby the main body 50 can stably freely move within the chamber 65.

Please refer to FIG. 1 or 3, which show that the main body 50 is assembled with the base seat 60 and the first and second operation boards 10, 20 (and the first and second restriction sections 30, 40). The assembling positions are such defined that the main body 50 is positioned in a first position in the chamber 65 of the base seat and the first and second operation boards 10, 20 are positioned in an open position.

Figure 4:
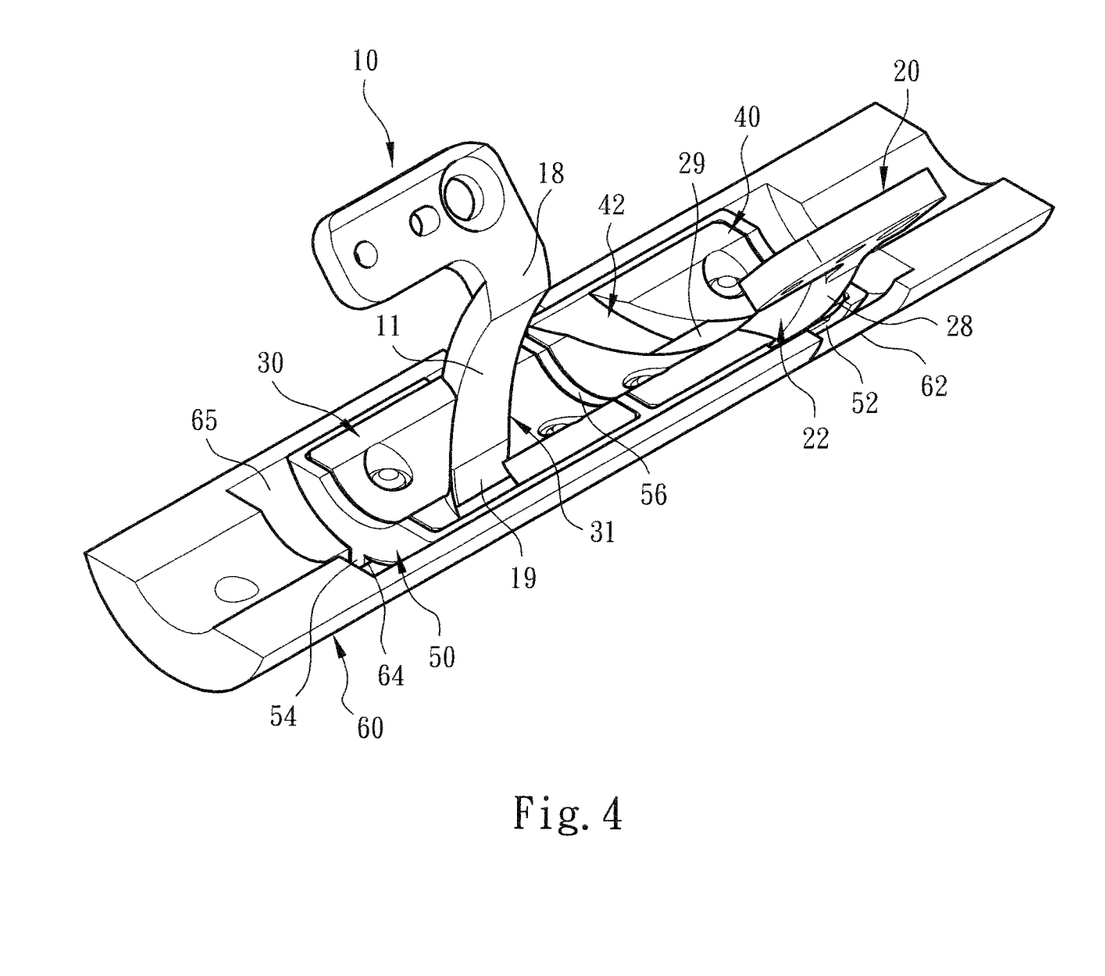
FIG. 4 is a perspective view of the operation of the present invention, showing that the first and second operation boards are moved from the open position to the closed position and the main body is moved from the first position to the second position.
Figure 5:
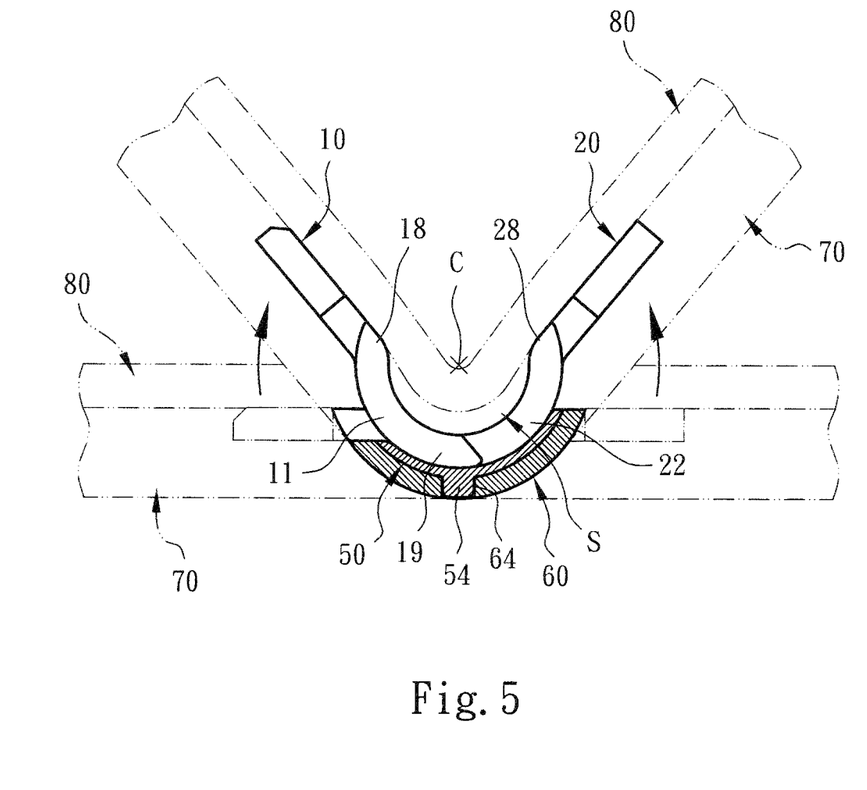
FIG. 5 is a sectional view of the present invention according to FIG. 4, in which the phantom lines show that the first and second operation boards are assembled with a case and a screen and the first and second operation boards rotate around a virtual axis.

Please refer to FIGS. 4 and 5. The phantom lines of FIG. 5 show that the first and second operation boards 10, 20 are assembled with a case 70 and a flexible screen 80. When a user operates the case 70 (or the flexible screen 80), the first and second operation boards 10, 20 are moved from the open position to the closed position in a manner as follows:
1. The first operation board 10 or the arm section 11 of the first operation board 10 and the second operation board 20 or the arm section 22 of the second operation board 20 rotate around a virtual axis C to respectively move along the first and second arched rails 31, 42. Accordingly, the arm section 11 of the first operation board 10 is forced to gradually protrude from the first notch 51 (or the first notch 61). At the same time, the main body 50 (or the first and second restriction sections 30, 40) are driven to move from the first position of the chamber 65 (or the right end of FIG. 4) to the second position (or the left end of FIG. 4). It should be noted that the virtual axis C is positioned at the center of the motional range (or rotational range) of the arm section 11 of the first operation board 10 and the arm section 22 of the second operation board 20.
2. In response to the move of the second restriction section 40, the second arched rail 42 synchronously drives the arm section 22 of the second operation board 20 to gradually protrude from the second notch 52 (or the second notch 62).

Figure 6:
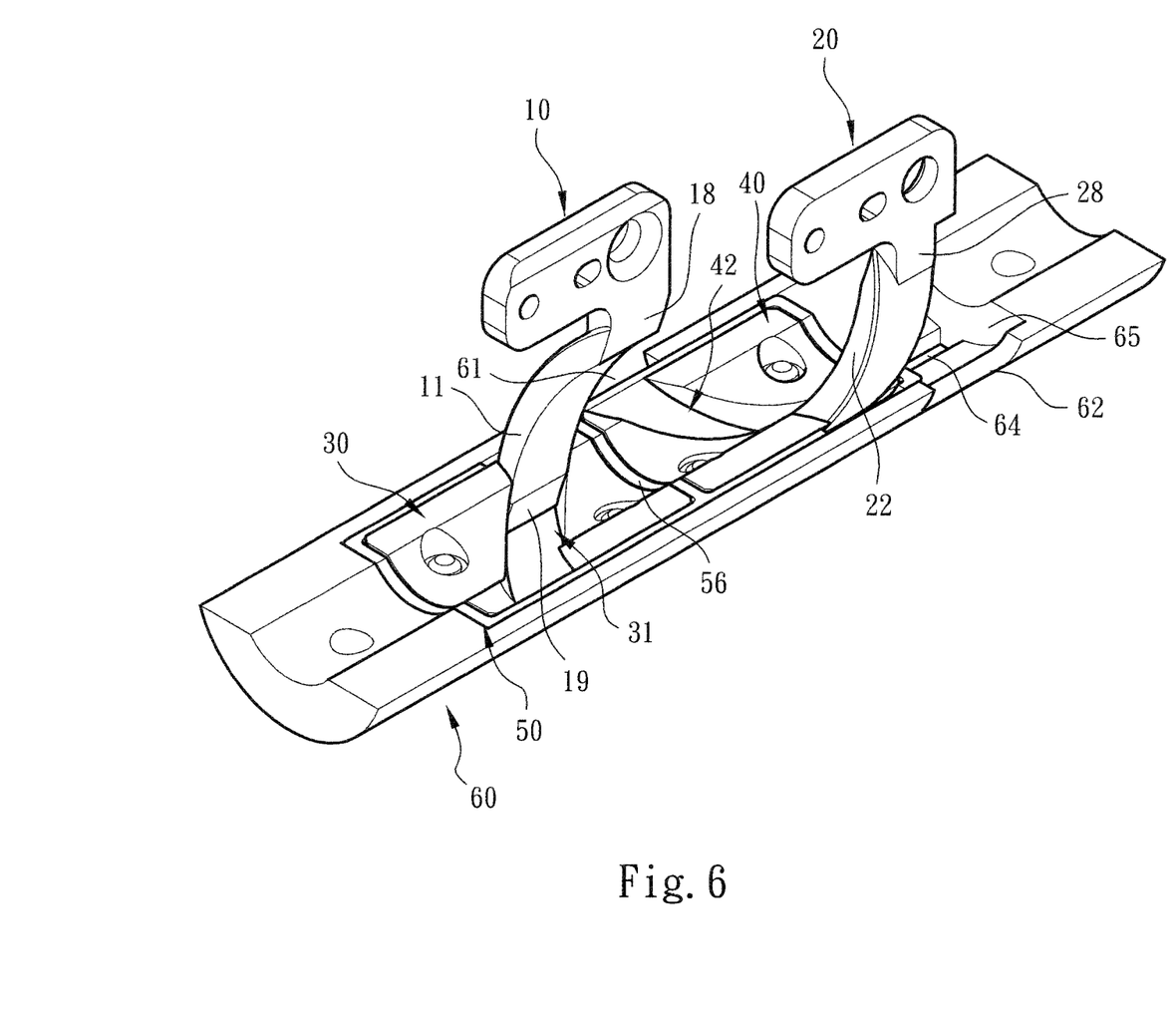
FIG. 6 is another perspective view of the operation of the present invention, showing that the first and second operation boards are positioned in the closed position and the main body is positioned in the second position.
Figure 7:
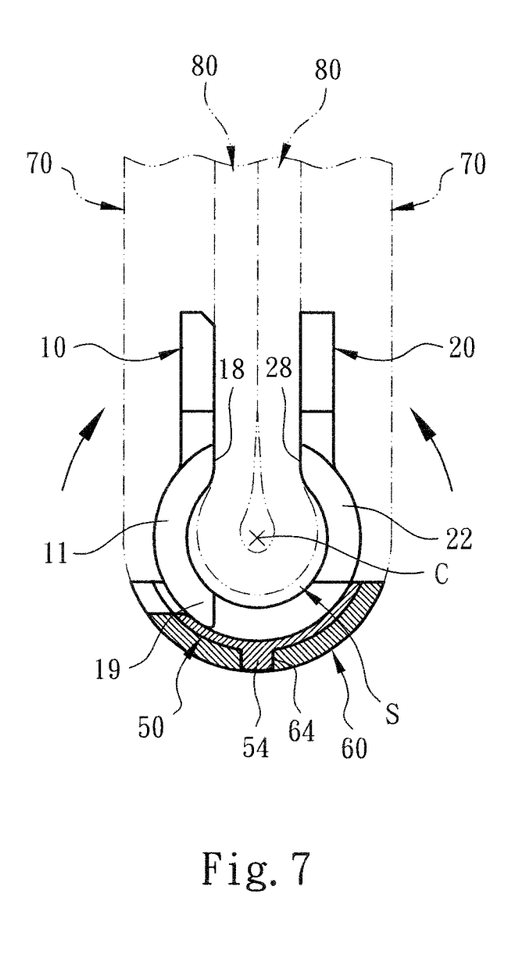
FIG. 7 is a sectional view according to FIG. 6, showing that the arm section of the first operation board and the arm section of the second operation board together define a space for receiving the bent section of the flexible screen.

Please now refer to FIGS. 6 and 7. When the first and second operation boards 10, 20 (or the case 70 and the flexible screen 80) reach the closed position, the main body 50 also reaches the second position from the first position of the chamber 65. Accordingly, the first and second operation boards 10, 20 (or the case 70 and the flexible screen 80) can be opened and closed.

It should be noted that as shown in FIG. 7, the arm section 11 of the first operation board 10 and the arm section 22 of the second operation board 20 together define a space S, (in which the virtual axis C is positioned) for receiving the bent section of the flexible screen 80. This improves the shortcomings of the conventional pivot shaft device that the structure is complicated and it is troublesome to manufacture and assemble the components and the assembling tolerance is large and the cost is high. Also, the components of the conventional pivot shaft device have larger volume to occupy more assembling/motional space. In contrast, in the present invention, the volume and the assembling/motional space are as minified as possible.

It should be noted that the first and second arched rails 31, 42 are curved and arranged along the virtual axis C. Also, the arched structures (or the curvature) of the arm section 11 of the first operation board 10 and the arm section 22 of the second operation board 20 are identical to the curvature of the first and second arched rails 31, 42.

Figure 8:
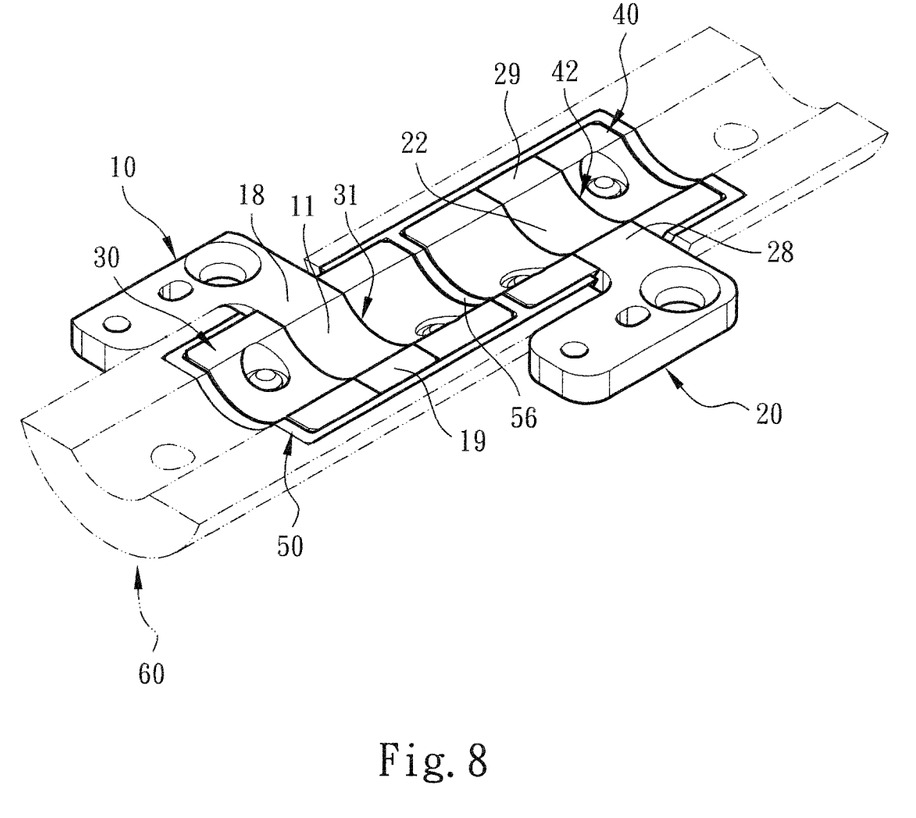
FIG. 8 is a perspective view of a modified embodiment of the present invention.
Figure 9:
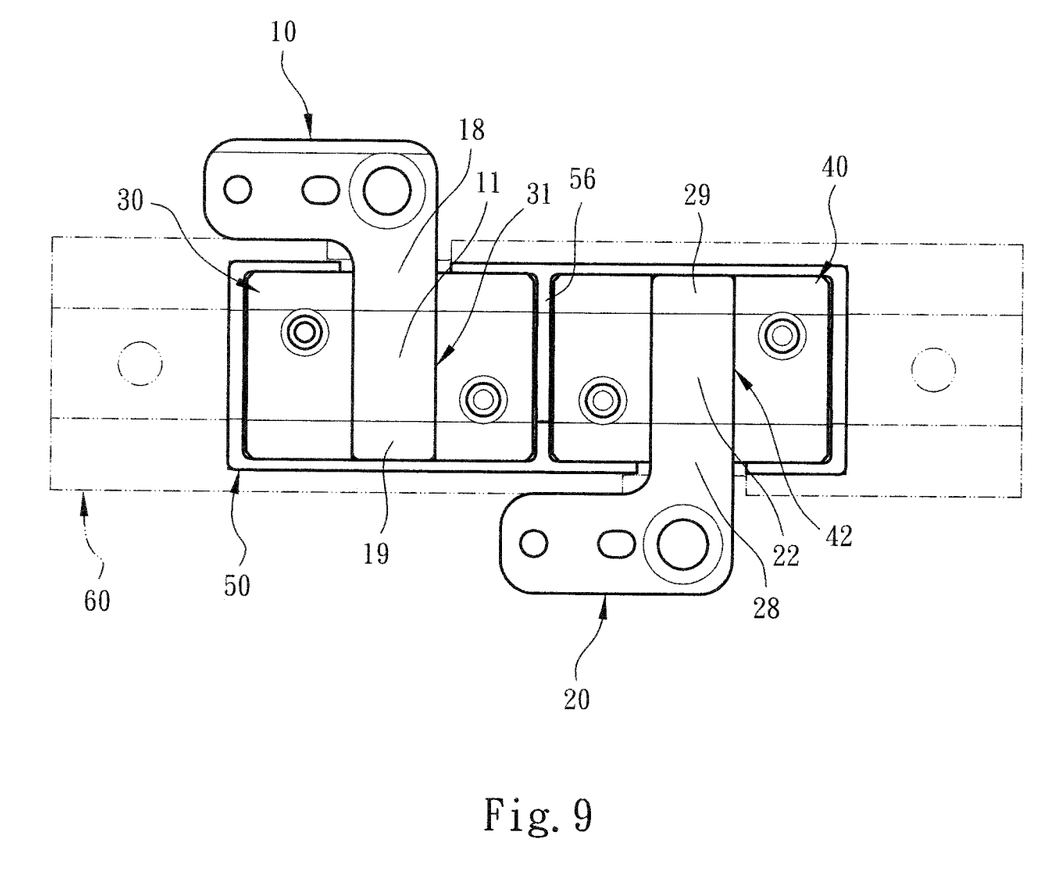
FIG. 9 is a plane view according to FIG. 8.

Please now refer to FIGS. 8 and 9. In a modified embodiment, the first arched rail 31 of the first restriction section 30 and the second arched rail 42 of the second restriction section 40 respectively perpendicularly extend from the upper side to the lower side of the main body 50. Also, the arm section 11 of the first operation board 10 and the arm section 22 of the second operation board 20 perpendicularly extend from the upper side (or the upper side of the drawing) to the lower side of the main body 50 corresponding to the first and second arched rails 31, 42.

It should be noted that the structural form of FIGS. 8 and 9 permits the first and second operation boards 10, 20 to asynchronously move. In this case, the base seat 60 and the chamber 65 can be selectively omitted.

To speak representatively, in condition that the requirement for lightweight and thin (or simplified) design of the electronic apparatus is satisfied, in comparison with the conventional pivot shaft device, the pivot shaft structure moving around virtual axis of the present invention has the following advantages:
1. The assembling structures of the main body 50 and the first and second operation boards 10, 20 have been redesigned to form a structure capable of rotating and/or moving. For example, the first and second restriction sections 30, 40 are disposed on the main body 10 to form the first and second arched rails 31, 42. The first and second operation boards 10, 20 are respectively formed with the arched protruding arm sections 11, 22, which can reciprocally move along the first and second arched rails 31, 42. Also, the main body 50 can move between the first and second positions in the chamber 65 of the base seat. These are obviously different from the structural form of the conventional pivot shaft device.
2. The assembling structures of the main body 50 and the first and second operation boards 10, 20 or the base seat 60 and the flexible screen 80 are able to achieve a beautiful appearance of the entire electronic apparatus and provide a simplified and beautified visual effect, whereby the shortcoming of the conventional pivot shaft device that the bent section of the flexible screen can be hardly received is improved. Also, the shortcoming of the conventional pivot shaft device that the cooperative components have larger volume to occupy more (gap/motional) space. Moreover, the shortcomings of the conventional pivot shaft device that the structure and the cooperative form are more complicated and it is troublesome to manufacture and assemble the components and the assembling tolerance is large and the cost is high are obviously improved.

In conclusion, the pivot shaft structure moving around virtual axis of the present invention is effective and different from the conventional pivot shaft device in space form. The pivot shaft structure moving around virtual axis of the present invention is inventive, greatly advanced and advantageous over the conventional pivot shaft device.

The above embodiments are only used to illustrate the present invention, not intended to limit the scope thereof.

Many modifications of the above embodiments can be made without departing from the spirit of the present invention.

What is claimed is:

1. A pivot shaft structure moving around virtual axis, comprising:
an assembly of a main body (50), a first operation board (10) and a second operation board (20) disposed on the main body (50), the main body (50) having a chamber (55), a first arched rail (31) and a second arched rail (42) positioned on the chamber (55), the first arched rail (31) and the second arched rail (42) being arched and disposed around a virtual axis (C), the first operation board (10) having an arched protruding arm section (11), the second operation board (20) having an arched protruding arm section (22), the arched protruding arm section (11) of the first operation board (10) and the arched protruding arm section (22) of the second operation board (20) each having a curvature that is equal to a curvature of the first arched rail (31) and a curvature of the second arched rail (42), the arm section (11) of the first operation board (10) and the arm section (22) of the second operation board (20) respectively having connection ends (18), (28) and free ends (19), (29), the arm section (11) of the first operation board (10) and the arm section (22) of the second operation board (20) being respectively received in the first arched rail (31) and the second arched rail (42), whereby when the first operation board (10) and the second operation board (20) move, the arm section (11) of the first operation board (10) and the arm section (22) of the second operation board (20) respectively move around the virtual axis (C) along the first arched rail (31) and the second arched rail (42) to two sides of the main body (50), the arm section (11) of the first operation board (10) and the arm section (22) of the second operation board (20) cooperating with the first arched rail (31) and the second arched rail (42) to together define a space (S).

2. The pivot shaft structure moving around virtual axis as claimed in claim 1, wherein the first arched rail (31) and the second arched rail (42) respectively having obliquely extending structures, the first arched rail (31) obliquely extending from an upper side to a lower side and left end of the main body (50), the second arched rail (42) obliquely extending from the upper side to the lower side and right end of the main body (50), the arm section (11) of the first operation board (10) obliquely extending from the connection end (18) to the free end (19) and the left end, the arm section (22) of the second operation board (20) obliquely extending from the connection end (28) to the free end (29) and the left end.

3. The pivot shaft structure moving around virtual axis as claimed in claim 2, wherein main body (50) is an arched plate body, whereby the chamber (55) is an open chamber with an arched cross-sectional structure, the upper side of the main body (50) being formed with a first notch (51), the lower side of the main body (50) being formed with a second notch (52), the first notch (51) being positioned in a position in adjacency to the middle of the main body (50), the second notch (52) being positioned in a position distal from the middle of the main body (50), a diaphragm (56) being in a middle position of the chamber (55) to partition the chamber (55) into a first cavity (58) and a second cavity (59), the first cavity (58) being in communication with the first notch (51), the second cavity (59) being in communication with the second notch (52).

4. The pivot shaft structure moving around virtual axis as claimed in claim 3, wherein multiple restriction sections are disposed in the chamber (55), the restriction sections being block bodies with arched cross section, the restriction sections being classified into first restriction section (30) and second restriction section (40) respectively positioned in the first cavity (58) and the second cavity (59), the first restriction section (30) defining the first arched rail (31) in communication with the first notch (51), the second restriction section (40) defining the second arched rail (42) in communication with the second notch (52).

5. The pivot shaft structure moving around virtual axis as claimed in claim 3, wherein the main body (50) is assembled and disposed on a base seat (60), the base seat (60) being an arched plate body having an open chamber (65) with an arched cross-sectional structure, the main body (50) being permitted to reciprocally move within the chamber (65) of the base seat (60), an upper side of the base seat (60) being formed with a first notch (61) corresponding to the first notch (51) of the main body, a lower side of the base seat (60) being formed with a second notch (62) corresponding to the second notch (52) of the main body, an assembling section (54) being disposed under the bottom section of the main body (50), the assembling section (54) being in the form of an elongated raised structure or an elongated sunken structure, a guide section (64) being disposed in the chamber (65) of the base seat (60), the guide section (64) being in the form of an elongated sunken structure or an elongated raised structure.

6. The pivot shaft structure moving around virtual axis as claimed in claim 2, wherein multiple restriction sections are disposed in the chamber (55), the restriction sections being block bodies with arched cross section, the restriction sections being classified into first restriction section (30) and second restriction section (40), the first restriction section (30) defining the first arched rail (31), the second restriction section (40) defining the second arched rail (42).

7. The pivot shaft structure moving around virtual axis as claimed in claim 6, wherein the main body (50) is assembled and disposed on a base seat (60), the base seat (60) being an arched plate body having an open chamber (65) with an arched cross-sectional structure, the main body (50) being permitted to reciprocally move within the chamber (65) of the base seat (60), an upper side of the base seat (60) being formed with a first notch (61), a lower side of the base seat (60) being formed with a second notch (62), an assembling section (54) being disposed under the bottom section of the main body (50), the assembling section (54) being in the form of an elongated raised structure or an elongated sunken structure, a guide section (64) being disposed in the chamber (65) of the base seat (60), the guide section (64) being in the form of an elongated sunken structure or an elongated raised structure.

8. The pivot shaft structure moving around virtual axis as claimed in claim 2, wherein the main body (50) is assembled and disposed on a base seat (60), the base seat (60) being an arched plate body having an open chamber (65) with an arched cross-sectional structure, the main body (50) being permitted to reciprocally move within the chamber (65) of the base seat (60), an upper side of the base seat (60) being formed with a first notch (61), a lower side of the base seat (60) being formed with a second notch (62), an assembling section (54) being disposed under the bottom section of the main body (50), the assembling section (54) being in the form of an elongated raised structure or an elongated sunken structure, a guide section (64) being disposed in the chamber (65) of the base seat (60), the guide section (64) being in the form of an elongated sunken structure or an elongated raised structure.

9. The pivot shaft structure moving around virtual axis as claimed in claim 1, wherein multiple restriction sections are disposed in the chamber (55), the restriction sections being block bodies with arched cross section, the restriction sections being classified into first restriction section (30) and second restriction section (40), the first restriction section (30) defining the first arched rail (31), the second restriction section (40) defining the second arched rail (42).

10. The pivot shaft structure moving around virtual axis as claimed in claim 9, wherein the main body (50) is assembled and disposed on a base seat (60), the base seat (60) being an arched plate body having an open chamber (65) with an arched cross-sectional structure, the main body (50) being permitted to reciprocally move within the chamber (65) of the base seat (60), an upper side of the base seat (60) being formed with a first notch (61), a lower side of the base seat (60) being formed with a second notch (62), an assembling section (54) being disposed under the bottom section of the main body (50), the assembling section (54) being in the form of an elongated raised structure or an elongated sunken structure, a guide section (64) being disposed in the chamber (65) of the base seat (60), the guide section (64) being in the form of an elongated sunken structure or an elongated raised structure.

11. The pivot shaft structure moving around virtual axis as claimed in claim 1, wherein the main body (50) is assembled and disposed on a base seat (60), the base seat (60) being an arched plate body having an open chamber (65) with an arched cross-sectional structure, the main body (50) being permitted to reciprocally move within the chamber (65) of the base seat (60), an upper side of the base seat (60) being formed with a first notch (61), a lower side of the base seat (60) being formed with a second notch (62), an assembling section (54) being disposed under the bottom section of the main body (50), the assembling section (54) being in the form of an elongated raised structure or an elongated sunken structure, a guide section (64) being disposed in the chamber (65) of the base seat (60), the guide section (64) being in the form of an elongated sunken structure or an elongated raised structure.

12. A pivot shaft structure moving around virtual axis, comprising:
an assembly of a main body (50), a first operation board (10) and a second operation board (20) disposed on the main body (50), the main body (50) having a chamber (55), a first arched rail (31) and a second arched rail (42) positioned on the chamber (55), the first arched rail (31) and the second arched rail (42) being arched and disposed around a virtual axis (C), the first operation board (10) having an arched protruding arm section (11), the second operation board (20) having an arched protruding arm section (22),
the first arched rail (31) and the second arched rail (42) respectively perpendicularly extend from the upper side to the lower side of the main body (50), the arm section (11) of the first operation board (10) and the arm section (22) of the second operation board (20) perpendicularly extending from the upper side to the lower side of the main body (50) corresponding to the first arched rail (31) and the second arched rail (42), the arm section (11) of the first operation board (10) and the arm section (22) of the second operation board (20) respectively having connection ends (18), (28) and free ends (19), (29), the arm section (11) of the first operation board (10) and the arm section (22) of the second operation board (20) being respectively received in the first arched rail (31) and the second arched rail (42), whereby when the first operation board (10) and the second operation board (20) move, the arm section (11) of the first operation board (10) and the arm section (22) of the second operation board (20) respectively move around the virtual axis (C) along the first arched rail (31) and the second arched rail (42) to two sides of the main body (50), the arm section (11) of the first operation board (10) and the arm section (22) of the second operation board (20) cooperating with the first arched rail (31) and the second arched rail (42) to together define a space (S).

13. The pivot shaft structure moving around virtual axis as claimed in claim 12, wherein main body (50) is an arched plate body, whereby the chamber (55) is an open chamber with an arched cross-sectional structure, the upper side of the main body (50) being formed with a first notch (51), the lower side of the main body (50) being formed with a second notch (52), the first notch (51) being positioned in a position in adjacency to the middle of the main body (50), the second notch (52) being positioned in a position distal from the middle of the main body (50), a diaphragm (56) being in a middle position of the chamber (55) to partition the chamber (55) into a first cavity (58) and a second cavity (59), the first cavity (58) being in communication with the first notch (51), the second cavity (59) being in communication with the second notch (52).

14. The pivot shaft structure moving around virtual axis as claimed in claim 13, wherein multiple restriction sections are disposed in the chamber (55), the restriction sections being block bodies with arched cross section, the restriction sections being classified into first restriction section (30) and second restriction section (40) respectively positioned in the first cavity (58) and the second cavity (59), the first restriction section (30) defining the first arched rail (31) in communication with the first notch (51), the second restriction section (40) defining the second arched rail (42) in communication with the second notch (52).

15. The pivot shaft structure moving around virtual axis as claimed in claim 12, wherein multiple restriction sections are disposed in the chamber (55), the restriction sections being block bodies with arched cross section, the restriction sections being classified into first restriction section (30) and second restriction section (40), the first restriction section (30) defining the first arched rail (31), the second restriction section (40) defining the second arched rail (42).

16. The pivot shaft structure moving around virtual axis as claimed in claim 12, wherein the main body (50) is assembled and disposed on a base seat (60), the base seat (60) being an arched plate body having an open chamber (65) with an arched cross-sectional structure, the main body (50) being permitted to reciprocally move within the chamber (65) of the base seat (60), an upper side of the base seat (60) being formed with a first notch (61), a lower side of the base seat (60) being formed with a second notch (62), an assembling section (54) being disposed under the bottom section of the main body (50), the assembling section (54) being in the form of an elongated raised structure or an elongated sunken structure, a guide section (64) being disposed in the chamber (65) of the base seat (60), the guide section (64) being in the form of an elongated sunken structure or an elongated raised structure.

17. A pivot shaft structure moving around virtual axis, comprising:

an assembly of a main body (50), a first operation board (10) and a second operation board (20) disposed on the main body (50), the main body (50) having a chamber (55), a first arched rail (31) and a second arched rail (42) positioned on the chamber (55), the first arched rail (31) and the second arched rail (42) being arched and disposed around a virtual axis (C), the first operation board (10) having an arched protruding arm section (11), the second operation board (20) having an arched protruding arm section (22), the arm section (11) of the first operation board (10) and the arm section (22) of the second operation board (20) respectively having connection ends (18), (28) and free ends (19), (29), the arm section (11) of the first operation board (10) and the arm section (22) of the second operation board (20) being respectively received in the first arched rail (31) and the second arched rail (42), whereby when the first operation board (10) and the second operation board (20) move, the arm section (11) of the first operation board (10) and the arm section (22) of the second operation board (20) respectively move around the virtual axis (C) along the first arched rail (31) and the second arched rail (42) to two sides of the main body (50), the arm section (11) of the first operation board (10) and the arm section (22) of the second operation board (20) cooperating with the first arched rail (31) and the second arched rail (42) to together define a space (S), the main body (50) is an arched plate body, whereby the chamber (55) is an open chamber with an arched cross-sectional structure, the upper side of the main body (50) being formed with a first notch (51), the lower side of the main body (50) being formed with a second notch (52), the first notch (51) being positioned in a position in adjacency to the middle of the main body (50), the second notch (52) being positioned in a position distal from the middle of the main body (50), a diaphragm (56) being in a middle position of the chamber (55) to partition the chamber (55) into a first cavity (58) and a second cavity (59), the first cavity (58) being in communication with the first notch (51), the second cavity (59) being in communication with the second notch (52).

18. The pivot shaft structure moving around virtual axis as claimed in claim 17, wherein multiple restriction sections are disposed in the chamber (55), the restriction sections being block bodies with arched cross section, the restriction sections being classified into first restriction section (30) and second restriction section (40) respectively positioned in the first cavity (58) and the second cavity (59), the first restriction section (30) defining the first arched rail (31) in communication with the first notch (51), the second restriction section (40) defining the second arched rail (42) in communication with the second notch (52).

19. The pivot shaft structure moving around virtual axis as claimed in claim 18, wherein the main body (50) is assembled and disposed on a base seat (60), the base seat (60) being an arched plate body having an open chamber (65) with an arched cross-sectional structure, the main body (50) being permitted to reciprocally move within the chamber (65) of the base seat (60), an upper side of the base seat (60) being formed with a first notch (61) corresponding to the first notch (51) of the main body, a lower side of the base seat (60) being formed with a second notch (62) corresponding to the second notch (52) of the main body, an assembling section (54) being disposed under the bottom section of the main body (50), the assembling section (54) being in the form of an elongated raised structure or an elongated sunken structure, a guide section (64) being disposed in the chamber (65) of the base seat (60), the guide section (64) being in the form of an elongated sunken structure or an elongated raised structure.

20. The pivot shaft structure moving around virtual axis as claimed in claim 17, wherein the main body (50) is assembled and disposed on a base seat (60), the base seat (60) being an arched plate body having an open chamber (65) with an arched cross-sectional structure, the main body (50) being permitted to reciprocally move within the chamber (65) of the base seat (60), an upper side of the base seat (60) being formed with a first notch (61) corresponding to the first notch (51) of the main body, a lower side of the base seat (60) being formed with a second notch (62) corresponding to the second notch (52) of the main body, an assembling section (54) being disposed under the bottom section of the main body (50), the assembling section (54) being in the form of an elongated raised structure or an elongated sunken structure, a guide section (64) being disposed in the chamber (65) of the base seat (60), the guide section (64) being in the form of an elongated sunken structure or an elongated raised structure.

* * * * *